United States Patent
Lee et al.

(10) Patent No.: US 12,557,398 B2
(45) Date of Patent: Feb. 17, 2026

(54) SOLAR CELL MODULE

(71) Applicant: HANWHA SOLUTIONS CORPORATION, Seoul (KR)

(72) Inventors: Jinhyung Lee, Seoul (KR); Hyojin Kim, Seoul (KR); Ayoung Bak, Seoul (KR); Changhyun Lee, Seoul (KR); Junseo Lee, Seoul (KR)

(73) Assignee: HANWHA SOLUTIONS CORPORATION, Seoul (KR)

( * ) Notice: Subject to any disclaimer, the term of this patent is extended or adjusted under 35 U.S.C. 154(b) by 0 days.

(21) Appl. No.: 18/457,230

(22) Filed: Aug. 28, 2023

(65) Prior Publication Data
US 2024/0339550 A1    Oct. 10, 2024

(30) Foreign Application Priority Data

Apr. 7, 2023   (KR) .................. 10-2023-0046240

(51) Int. Cl.
*H10F 19/80* (2025.01)
*H10F 77/20* (2025.01)

(52) U.S. Cl.
CPC ........... *H10F 19/80* (2025.01); *H10F 77/215* (2025.01)

(58) Field of Classification Search
None
See application file for complete search history.

(56) References Cited

U.S. PATENT DOCUMENTS

| | | | | |
|---|---|---|---|---|
| 2009/0277496 | A1* | 11/2009 | Khazeni | H01L 31/0547 136/246 |
| 2011/0232744 | A1* | 9/2011 | Larsen | H10F 77/147 136/256 |
| 2013/0152994 | A1* | 6/2013 | Schaarschmidt | H10F 19/904 136/244 |
| 2013/0306134 | A1* | 11/2013 | Kuromiya | H10F 77/315 136/246 |

(Continued)

FOREIGN PATENT DOCUMENTS

| | | |
|---|---|---|
| JP | 2011-135011 A | 7/2011 |
| KR | 101874827 B1 | 7/2018 |
| KR | 2022-0023036 A | 3/2022 |

OTHER PUBLICATIONS

Extended European Search Report dated Jul. 26, 2024 issued in European Patent Application No. 23186718.5-1002.

(Continued)

*Primary Examiner* — Ryan S Cannon
(74) *Attorney, Agent, or Firm* — Harness, Dickey & Pierce, P.L.C.

(57) ABSTRACT

A solar cell module is disclosed. The solar cell module according to an embodiment of the present invention may include: a solar cell including an electrode, wherein the electrode generates electricity using sunlight and transfers electricity; a first substrate disposed above the solar cell; and a second substrate disposed below the solar cell, wherein the first substrate comprises: a body; an convex portion protruding upward from the body; an concave portion formed close to the body than the convex portion; and an inflection portion formed at a midpoint between the convex portion and the concave portion, and wherein a distance between the concave portion and the inflection portion is greater than a width of the electrode.

10 Claims, 6 Drawing Sheets

(56) References Cited

U.S. PATENT DOCUMENTS

2014/0109952 A1* 4/2014 Jang .................. H10F 77/484
 136/246
2018/0130921 A1 5/2018 Mayer et al.
2019/0241455 A1 8/2019 Sweney et al.
2021/0044250 A1 2/2021 Liu et al.

OTHER PUBLICATIONS

Office Action for Korean Patent Application No. 10-2023-0046240 dated Jun. 21, 2023.
Artsun. "A More Beautiful Solar, the New Name for Hanwha Qcells' BIPV." Nov. 3, 2022 (with English translation).
Jeon, Soyeon. "Hanwha Qcells Unveils 'BIPV Module' Prototype: Strengthening Solar Power." Nov. 3, 2022 (with English translation).
Kim, Minsung. "Hanwha Qcells Unveils First Prototype of Building-Integrated Photovoltaic module." Nov. 3, 2022 (with English translation).

* cited by examiner

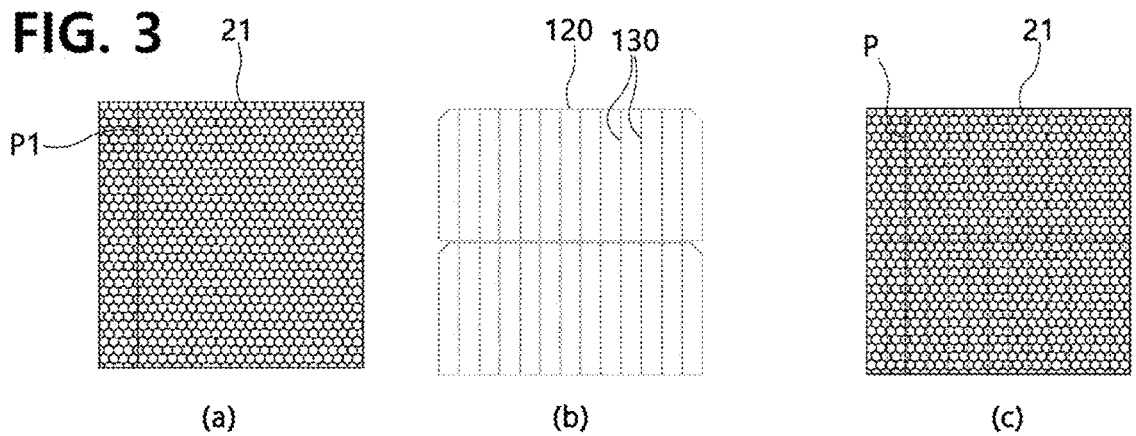
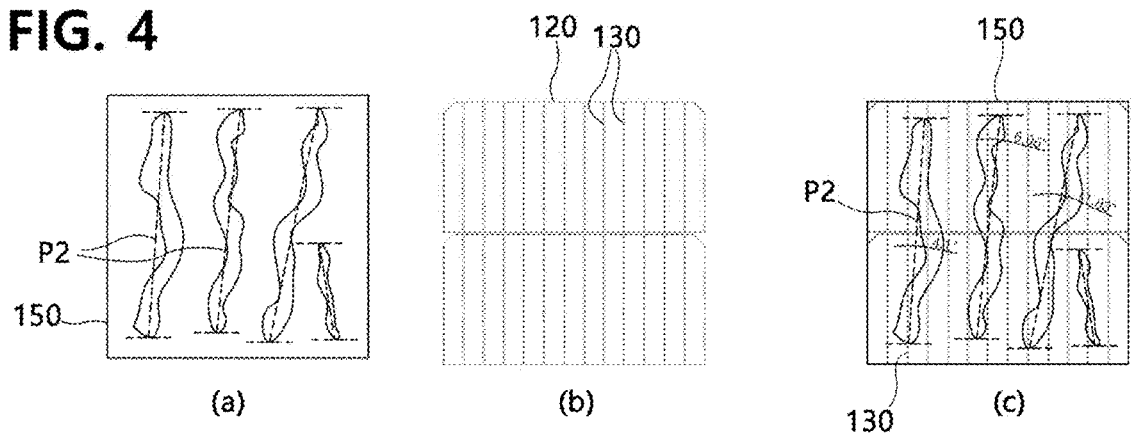

(a)  (b)

FIG. 11 <u>400</u>
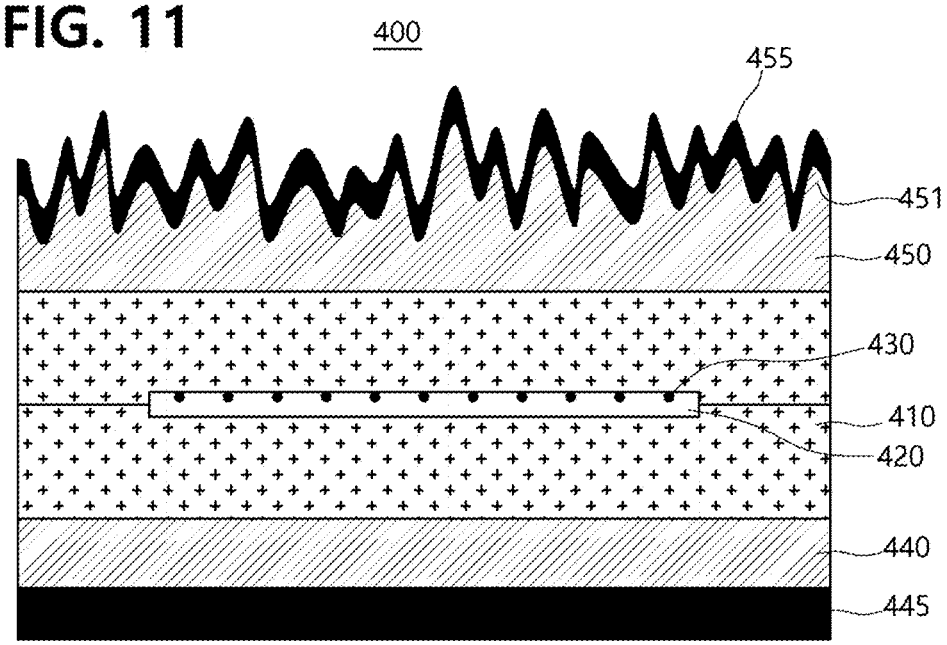

SOLAR CELL MODULE

CROSS-REFERENCE TO RELATED APPLICATION

This application claims priority under 35 USC § 119 to Korean Patent Application No. 10-2023-0046240 filed on Apr. 7, 2023 in the Korean Intellectual Property Office (KIPO), the entire disclosure of which is incorporated herein by reference.

FIELD

The present invention relates to a solar cell module, and more particularly to, a solar cell module that minimizes a reduction in the light-receiving area of the solar cell module and simultaneously conceals the inside of the solar cell module.

BACKGROUND

Conventionally, a solar cell performs a function of converting sunlight energy into electrical energy. These solar cells are used as an exterior materials of buildings, and attempts to meet demands for eco-friendly energy have been continued.

In particular, a building integrated photovoltaic system (BPPV) is a system for obtaining eco-friendly energy by using solar cell modules as building materials, and is largely divided into a roof type installed on a roof and a wall type installed on a side surface of buildings.

The BPPV uses solar cell modules as an exterior materials to reduce construction costs while eliminates a need for a separate installation space, and thus is in the spotlighted in terms of energy efficiency.

However, a general solar cell module is provided with an electrode for transferring electricity, and when these electrodes is recognized from the outside, there is a problem in that the aesthetics of the buildings is deteriorated.

In addition, when these electrodes are concealed by a separate configuration, there is a problem in that the overall light receiving area of the solar cell module is reduced, and efficiency of production of electric energy is lowered.

SUMMARY

The disclosure has been made in view of the above problems, and an object of the disclosure is to provide a solar cell module that conceals the inside while minimizing the reduction in the light receiving area of the solar cell module.

The disclosure is not limited to the above-described tasks, and other tasks not described herein will be clearly understood by those skilled in the art from the following description.

According to an aspect of the disclosure, there is provided a solar cell module including: a solar cell including an electrode, wherein the electrode generates electricity using sunlight and transfers electricity; a first substrate disposed above the solar cell; and a second substrate disposed below the solar cell, wherein the first substrate comprises: a body; an convex portion protruding upward from the body; an concave portion formed close to the body than the convex portion; and an inflection portion formed at a midpoint between the convex portion and the concave portion, and wherein a distance between the concave portion and the inflection portion is greater than a width of the electrode.

In this case, the concave portion may be formed to correspond to a longitudinal direction of the electrode.

In this case, an angle between the concave portion and the electrode may be less than 20°.

In this case, the width of the electrode may be 180 to 350 µm, and the distance between the concave portion and the inflection portion may be 500 µm.

In this case, a slope of a curved surface between the concave portion and the inflection portion may increase and a slope of a curved surface between the inflection portion and the convex portion may decrease.

In this case, a slope of a curved surface between the concave portion and the inflection portion and a slope of a curved surface between the inflection portion and the convex portion may be the same in the inflection portion.

In this case, the solar module may further include a non-transmissive coating layer disposed below the second substrate.

In this case, the second substrate may include a second body formed to be curved.

In this case, the solar cell module may further include a transmissive coating layer disposed above the first substrate.

In this case, the solar cell module may further include a non-transmissive coating layer disposed below the second substrate.

According to the above configuration, the solar cell module according to the embodiment of the disclosure provides the following effects:

As the width of the electrode is smaller than the distance between the concave portion and the inflection portion, diffuse reflection of sunlight is generated between the concave portion and the inflection portion, and the diffuse reflection of sunlight has an effect of visually concealing the electrode.

In addition, since a separate concealing structure is not present between the concave portion and the inflection portion, the overall light receiving area of the solar cell module is prevented from being reduced, and thus the efficiency of producing electric energy is prevented from being lowered.

BRIEF DESCRIPTION OF THE DRAWINGS

FIG. 3 is a plan view illustrating a conventional solar cell module.

FIG. 4 is a plan view illustrating a solar cell module according to an embodiment of the present invention.

FIG. 11 is a cross-sectional view schematically illustrating a solar cell module according to another embodiment of the present invention.

DETAILED DESCRIPTION

Figure 1:
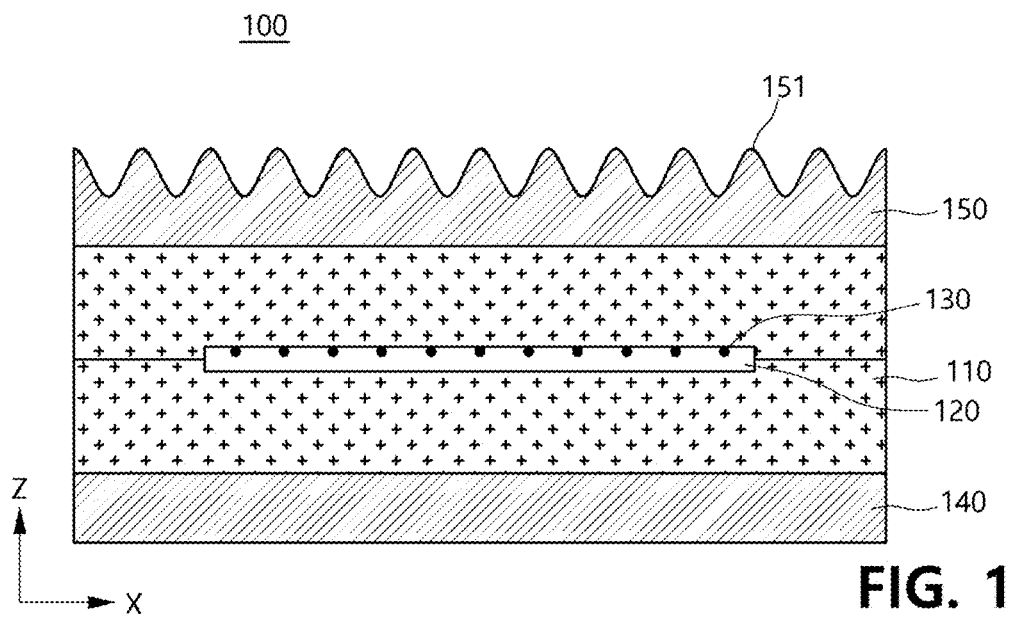
FIG. 1 is a cross-sectional view schematically illustrating a solar cell module according to an embodiment of the present invention.

Hereinafter, embodiments of the present invention will be described in detail with reference to the accompanying drawings so that those skilled in the art can easily carry out the present invention. The present invention may be embodied in various different forms and is not limited to the embodiments described herein. In order to clearly describe the present invention, parts not related to the description are omitted in the drawings, and the same reference numerals are used to refer to the same or similar elements throughout the specification.

The words and terms used in the specification and the claims are not to be construed as limited to ordinary or dictionary meanings, but should be construed as meanings and concepts corresponding to technical aspects of the present invention according to principles capable of defining terms and concepts by the inventor in order to describe the invention in the best way.

Therefore, the embodiments described in the specification and the configurations illustrated in the drawings correspond to a preferred embodiment of the present invention and do not all represent the technical aspects of the present invention, and thus the corresponding configurations may have various equivalents and modifications to replace them in the present application.

It should be understood that the terms such as "include" or "have" are intended to describe the presence of stated features, numbers, steps, operations, elements, components, or combinations thereof, and do not preclude the presence or addition of one or more other features, numbers, steps, operations, elements, components, or combinations thereof.

It is to be understood that any element is located in the "front", "rear", "above" or "below" of another element, unless otherwise defined, not only is located in the "front", "rear", "above" or "below" immediately adjacent to the other element, but also includes a case in which another element is located in the middle. In addition, it is to be understood that any element is "connected" to another element, unless otherwise defined, not only is directly connected to each other but also includes a case in which the element is indirectly connected to each other.

Hereinafter, a solar cell module according to an embodiment of the present invention will be described with reference to the drawings.

Figure 2:
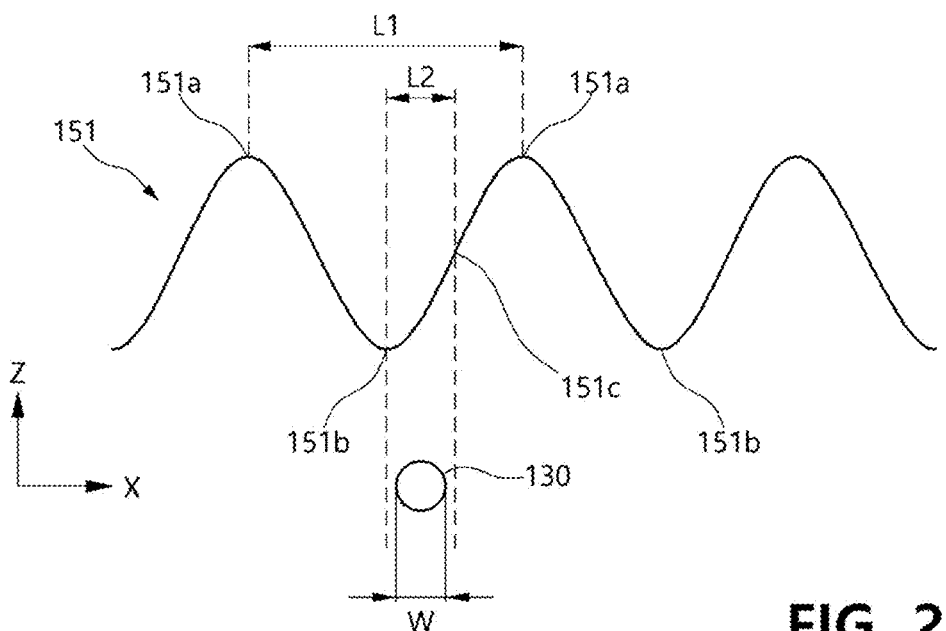
FIG. 2 is a view illustrating a convex portion, a concave portion, and an electrode of a first substrate of the solar cell module according to an embodiment of the present invention.

FIG. 1 is a cross-sectional view schematically illustrating a solar cell module according to an embodiment of the present invention, and FIG. 2 is a view illustrating a convex portion, a concave portion, and an electrode of a first substrate of the solar cell module according to an embodiment of the present invention.

Referring to FIGS. 1 and 2, the solar cell module 100 according to an embodiment of the present invention includes a sealing unit 110, a solar cell 120, an electrode 130, a first substrate 150, and a second substrate 140, and the solar cell module 100 may perform function of an exterior material of a building.

The sealing unit 110 is formed to accommodate the solar cell 120. In addition, the sealing unit 110 is formed to surround the solar cell 120. The sealing unit 110 protects the solar cell 120 from an external influence. And, the sealing unit 110 may be made of a resin material. However, the sealing unit 110 is not limited to being made of a resin material, but may be made of various materials capable of protecting the solar cell 120.

The solar cell 120 converts sunlight energy into electrical energy. That is, the solar cell 120 receives sunlight and generates electricity. The solar cell 120 may be made of a silicon material. However, the solar cell 120 is not limited to a silicon material, and may be made of various materials such as a perovskite material.

And, the solar cell 120 includes an electrode 130 for transferring electricity. In this case, the electrode 130 may be formed along a direction perpendicular to an Z axis and a direction perpendicular to an X axis.

In additions, the plurality of electrodes 130 may be formed. The plurality of electrodes 130 may be formed in parallel to each other. In addition, the electrode 130 of the present invention may be disposed inside the solar cell 120. According to various embodiments of the present invention, the electrode 130 may be disposed above the solar cell 120. Also, according to various embodiments of the present invention, the electrode 130 may be disposed above and below the solar cell 120, respectively.

The first substrate 150 is disposed above the sealing unit 110. The first substrate 150 is disposed above the solar cell 120. In this case, the first substrate 150 may be made of a glass material. However, the first substrate 150 is not limited to a glass material, and may be made of various materials that transmit light.

As illustrated in FIG. 2, the first substrate 150 may include a body 151, a convex portion 151a, a concave portion 151b, and an inflection portion 151c.

The body 151 is disposed above the sealing unit 110.

The convex portion 151a is formed to protrude upward from the body 151. The plurality of convex portions 151a may be formed. A distance between the plurality of convex portions 151a may be defined as a first length L1.

The concave portion 151b is formed close to the body 151 than the convex portion 151a. The plurality of concave portions 151b may be formed. A distance between the plurality of concave portions 151b may be equal to the first length L1.

The inflection portion 151c may be formed at an midpoint between the convex portion 151a and the concave portion 151b.

In this case, a distance between the concave portion 151b and the inflection portion 151c may be defined as a second length L2. The second length L2 is half of the first length L1.

In addition, according to various embodiments of the present invention, the inflection portion 151c is formed to be inclined between the convex portion 151a and the concave portion 151b. A slope of a curved surface between the concave portion 151b and the inflection portion 151c increases along the X-axis direction. Conversely, a slope of a curved surface between the inflection portion 151c and the concave portion 151b decreases along an opposite direction of the X-axis direction.

And, a slope of a curved surface between the inflection portion 151c and the convex portion 151a decreases along the X-axis direction. On the contrary, a slope of a curved surface between the convex portion 151a and the inflection portion 151c increases along an opposite direction of the X-axis direction.

In this case, in the inflection portion 151c, a slope of a curved surface between the concave portion 151b and the inflection portion 151c is the same as a slope of a curved surface between the inflection portion 151c and the convex portion 151a. For example, the inflection portion 151c may be an inflection point at which a change in the slope of the curved surface between the convex portion 151a and the concave portion 151b becomes zero.

Accordingly, diffused reflection of sunlight incident from the upper side of the first substrate 150 is generated between the concave portion 151b and the inflection portion 151c.

The electrode 130 is disposed below between the valley 151b and the convex portion 151a. In this case, since diffused reflection of sunlight incident from above the first substrate 150 is generated between the concave portion 151b and the convex portion 151a, the electrode 130 may be visually concealed by the diffused reflection of sunlight.

In addition, according to an embodiment of the present invention, the concave portion 151b may be formed in parallel with the convex portion 151a. In this case, the concave portion 151b is formed to correspond to the longitudinal direction of the electrode 130. Accordingly, the diffused reflection of sunlight generated between the concave portion 151b and the inflection portion 151c visually conceals the electrode 130.

In addition, according to an embodiment of the present invention, a distance L2 between the concave portion 151b and the inflection portion 151c is greater than a width W of the electrode 130. In addition, according to various embodiments of the present invention, the width W of the electrode 130 may be equal to a distance L2 between the concave portion 151b and the inflection portion 151c.

$$W \leq L2 \qquad (1)$$

As such, the electrode 130 is disposed below a region of diffused reflection of sunlight generated between the concave portion 151b and the inflection portion 151c, so that the electrode 130 is visually concealed.

In addition, according to an embodiment of the present invention, the width W of the electrode 130 is 180 to 350 µm. Specifically, the width W of the electrode 130 may be 250 µm.

Also, the distance L2 between the concave portion 151b and the inflection portion 151c may be 500 µm.

As described above, as the width W of the electrode 130 is smaller than the distance L2 between the concave portion 151b and the inflection portion 151c, the electrode 130 has an advantage in that the concealment rate is increased by the diffused reflection of sunlight generated between the concave portion 151b and the inflection portion 151c.

The second substrate 140 is disposed below the sealing unit 110. That is, the second substrate 140 is disposed below the solar cell 120. The material of the second substrate 140 may be the same as that of the first substrate 150. Accordingly, sunlight may be transferred to the solar cell 120 via the second substrate 140.

FIG. 3 is a plan view illustrating a solar cell module compared to a solar cell module according to an embodiment of the present invention, and FIG. 4 is a plan view illustrating a solar cell module according to another embodiment of the present invention.

First, as illustrated in FIG. 3(A), the first substrate 21 of the conventional solar cell module is formed such that a plurality of hexagonal pattern structures are regularly arranged. And, the plurality of hexagonal pattern structures are arranged along a first pattern axis P1.

In addition, as illustrated in FIG. 3(B), the plurality of electrodes 130 are formed in parallel to each other in the solar cell 120.

In addition, as illustrated in FIG. 3(C), when the first substrate 21 is formed to be disposed above the solar cell 120, the first pattern axis P1 of the plurality of hexagonal pattern structures is in parallel with the plurality of electrodes 130.

As described above, the conventional solar cell module visually conceals the plurality of electrodes 130 by the diffused reflection of sunlight by the plurality of hexagonal pattern structures.

Specifically, the Haze measurement value of the conventional solar cell module is approximately 74.6. Here, the Haze measurement value indicates the degree of diffused reflection of sunlight. For example, the higher the Haze measurement value, the greater the diffused reflection of sunlight. However, it is not considered that the concealment rate of the plurality of electrodes 130 is high only with the Haze measurement value.

Next, as illustrated in FIG. 4(A), the first substrate 150 of the solar cell module according to another embodiment of the present invention is formed such that the convex portion and the concave portion are irregularly arranged, and an external appearance of the solar cell module of the present invention has a wave pattern structure.

The wave pattern structure is arranged along a second pattern axis P2. Here, the second pattern axis P2 may correspond to the convex portion or the concave portion.

In addition, as illustrated in FIG. 4(B), the plurality of electrodes 130 are formed in parallel to each other in the solar cell 120.

Further, as shown in FIG. 4(C), when the first substrate 150 is formed to be disposed above the solar cell 120, the second pattern P2 having the plurality of wave pattern structures is formed to be inclined at a specific angle with the plurality of electrodes 130.

As described above, the solar cell module according to another embodiment of the present invention visually conceals the plurality of electrodes 130 due to sunlight diffused reflection by the plurality of wave pattern structures.

At this time, the Haze measurement value of the solar cell module according to another embodiment of the present invention is approximately 51.3, and it can be seen that the Haze measurement value of the solar cell module of the present invention is lower than that of the conventional solar cell module, and thus diffused reflection of sunlight is less than that of the conventional solar cell module.

Meanwhile, as mentioned above, a concealment rate of the plurality of electrodes is not determined simply by the Haze measurement value, and the combination of a structure formed on the first substrate and a width of the electrode determines the concealment rate.

Specifically, when comparing the plurality of hexagonal pattern structures of the conventional solar cell module with the plurality of wave pattern structures of the solar cell module of the present invention, the width of the plurality of wave pattern structures of the present invention is formed to be wider than the width of the plurality of conventional hexagonal pattern structures.

That is, one of the conventional hexagonal pattern structures is formed to conceal one of the plurality of electrodes, but one of the plurality of wave pattern structures of the present invention is formed to conceal two or more of the plurality of electrodes.

To this end, an angle between the second pattern axis P2 of the plurality of wave pattern structures and the electrode 130 may be less than 20°. For example, as shown in FIG. 4(C), the angle between the second pattern axis P2 of the plurality of wave pattern structures and the electrode 130 may be 4.1°, 6.06°, or 11.83°.

As described above, the second pattern axis P2 of the plurality of wave pattern structures is formed to be inclined at a predetermined angle with the electrode 130, and so that one wave pattern structure is arranged above two or more of the plurality of electrodes 130, thereby improving the concealment rate of the plurality of electrodes 130 compared to the concealment rate of the conventional hexagonal pattern structure.

Figure 5:
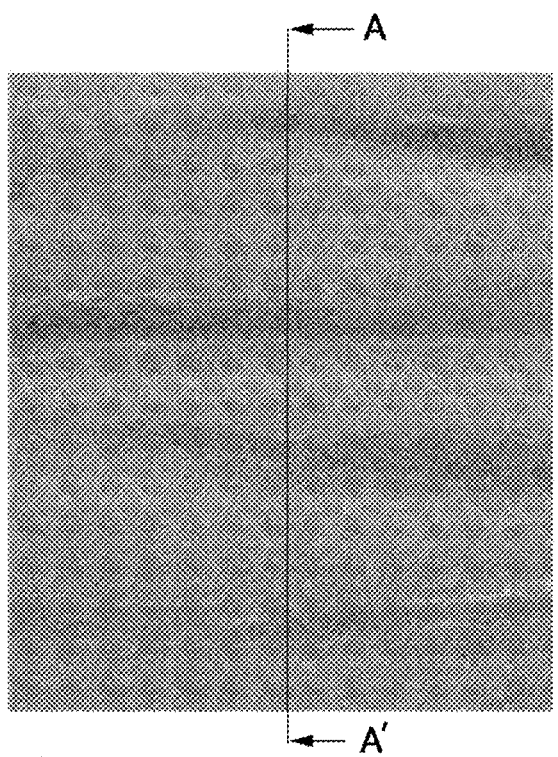
FIG. 5 is a plan view illustrating a solar cell module according to another embodiment of the present invention.
Figure 6:
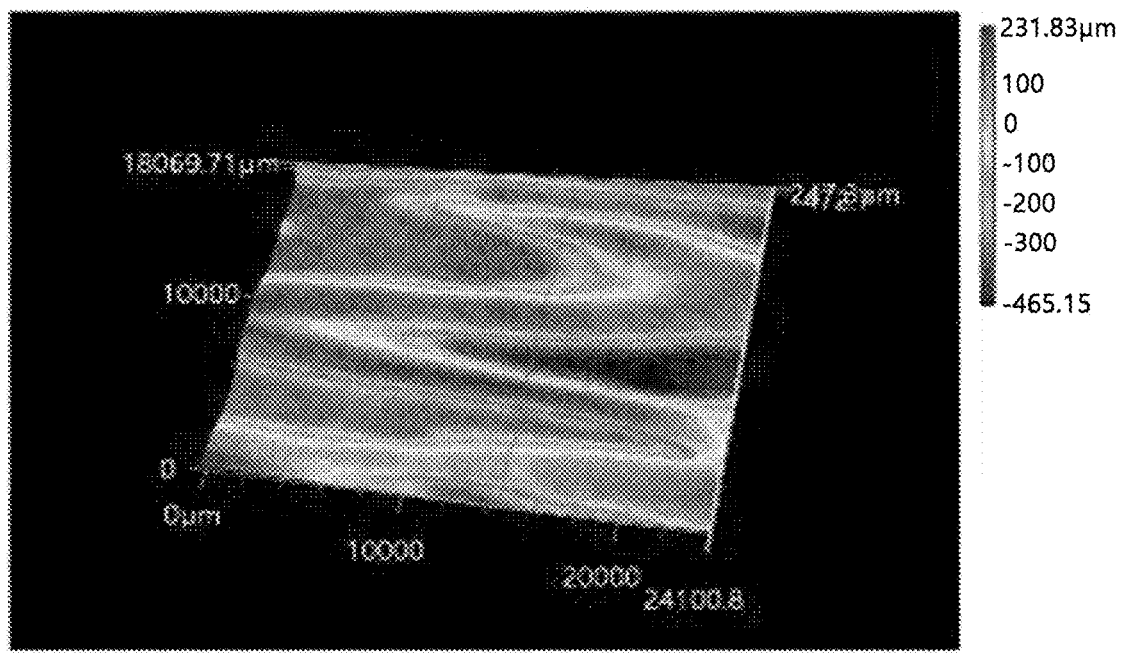
FIG. 6 is a three-dimensional view illustrating a height of a solar cell module according to another embodiment of the present invention.
Figure 7:
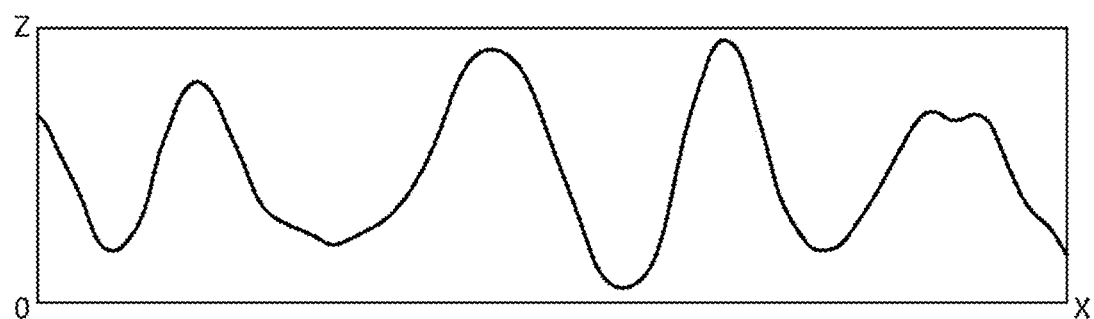
FIG. 7 is a cross-sectional view illustrated in FIG. 5 of A-A'.

FIG. 5 is a plan view illustrating a solar cell module according to another embodiment of the present invention, FIG. 6 is a three-dimensional view illustrating a height of a solar cell module according to another embodiment of the present invention, and FIG. 7 is a cross-sectional view illustrated in FIG. 5 of A-A'.

As shown in FIG. 5, according to the external appearance of the solar cell module according to another embodiment of the present invention, a convex portion and a concave portion may be irregularly arranged.

Further, FIG. 6 is a simulation to sterically confirm the external appearance of the solar cell module shown in FIG. 5, and it can be seen that the convex portion and the concave portion may be irregularly arranged.

FIG. 7 is a graph for identifying the height of the convex portion and the concave portion and the distance between them, an X-axis is an index for identifying the distance between the ridge and the valley, and an Z-axis means the height.

As shown in FIG. 7, the plurality of convex portions are alternately formed with the plurality of concave portions. The inflection portion is formed at an midpoint between one of the plurality of concave portions and one of the plurality of convex portions. In this case, the inflection portions are composed of a plurality so as to correspond to the plurality of convex portions and the plurality of concave portions, and the plurality of inflection portions are formed at each of a plurality of midpoints between the plurality of concave portions and the plurality of convex portions. Accordingly, since the distance between the plurality of concave portions and the plurality of inflection portions may be different, the width of the electrode may be smaller than an average value of the distance between the plurality of concave portions and the plurality of inflection portions.

Figure 8:
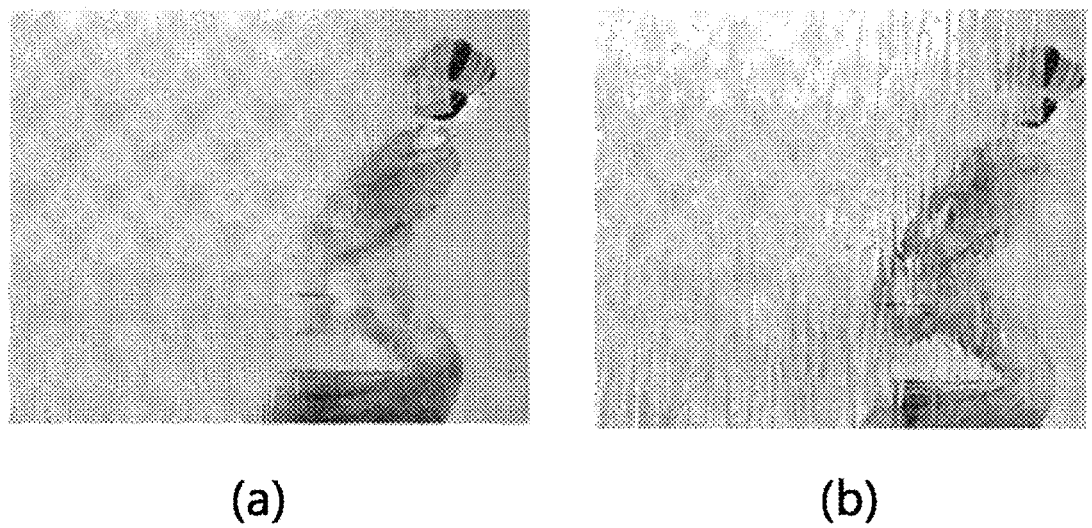
FIG. 8(A) is a view illustrating an external appearance of a solar cell module according to an embodiment of the present invention.
FIG. 8(B) is a view illustrating an external appearance of a solar cell module according to another embodiment of the present invention.

FIG. 8(A) is a view illustrating an external appearance of a solar cell module according to an embodiment of the present invention, and FIG. 8(B) is a view illustrating an external appearance of a solar cell module according to another embodiment of the present invention.

First, as illustrated in FIG. 8(A), in the solar cell module according to an embodiment of the present invention, the convex portions and concave portions are regularly arranged, and the interval between the convex portions and concave portions is formed narrower than the solar cell module of FIG. 8(B), and since diffused reflection of sunlight is regularly generated, the uniformity of the external appearance of the solar cell module is improved.

In addition, as illustrated in FIG. 8(B), in the solar cell module according to another embodiment of the present invention, the convex portions and concave portions are irregularly arranged, and the interval between the convex portions and concave portions is formed wider than the solar cell module of FIG. 8(A), and the wave shape is clear than the solar cell module illustrated in FIG. 8(A). Meanwhile, in the solar cell module of FIG. 8(B), as the convex portions and concave portions are irregularly arranged, the interval between the ridges and the valleys is formed relatively wider, thereby improving the concealment rate of hiding the electrode from the outside.

Figure 9:
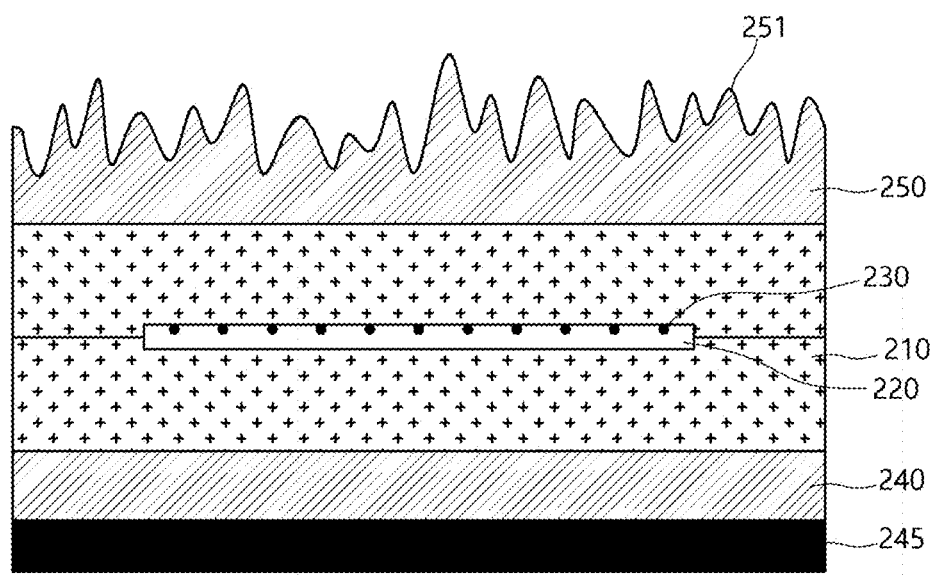
FIG. 9 is a cross-sectional view schematically illustrating a solar cell module according to another embodiment of the present invention.

FIG. 9 is a cross-sectional view schematically illustrating a solar cell module according to another embodiment of the present invention.

Referring to FIG. 9, a solar cell module 200 according to another embodiment of the present invention may include a sealing unit 210, a solar cell 220, an electrode 230, a first substrate 250, a second substrate 240, and a non-transmissive coating layer 245, and a description of components similar to or identical to the above-described embodiment is replaced with the description, and the non-transmissive coating layer 245 will be mainly described.

First, as illustrated in FIG. 9, the convex portions and concave portions of the first substrate 250 may be irregularly formed, unlike the above-described embodiment.

The non-transmissive coating layer 245 is disposed below the second substrate 240. The non-transmissive coating layer 245 may be made of a ceramic material. In this case, the non-transmissive coating layer 245 has a black color. However, the non-transmissive coating layer 245 is not limited to having a black color, and may have various colors that do not transmit sunlight.

Such as, the non-transmissive coating layer 245 blocks sunlight from passing through the second substrate 240 and the first substrate 250. That is, sunlight is blocked from being moved to the outside via the second substrate 240 and the first substrate 250. Accordingly, the non-transmissive coating layer 245 blocks sunlight entering through the second substrate 240, and thus the electrode 230 is prevented from being visually exposed to the outside by the sunlight introduced through the second substrate 240.

Figure 10:
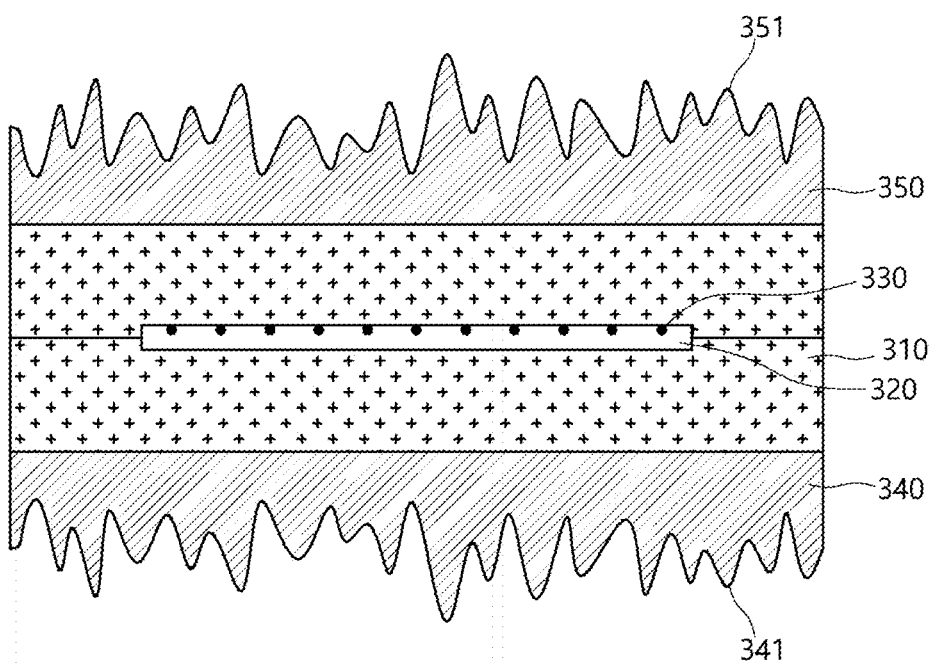
FIG. 10 is a cross-sectional view schematically illustrating a solar cell module according to another embodiment of the present invention.

FIG. 10 is a cross-sectional view schematically illustrating a solar cell module according to another embodiment of the present invention.

Referring to FIG. 10, the solar cell module 300 according to another embodiment of the present invention includes a sealing unit 310, a solar cell 320, an electrode 330, a first substrate 350, and a second substrate 340, and a description of components similar or identical to those of the above-described embodiments is replaced with the above description, and the second substrate 340 will be mainly described.

The second substrate 340 includes a second body 341 formed to be curved. That is, the second substrate 340 may be formed similar or identical to the first substrate 350.

Accordingly, when the second substrate 340 faces the inside of a building, the second body 341 of the second substrate 340 is formed to be curved, and thus, the second substrate 340 visually conceals the electrode 330.

As described above, the solar cell module 300 according to another embodiment of the present invention may secure not only the aesthetics of the exterior of the building but also the aesthetics of the interior of the building.

FIG. 11 is a cross-sectional view schematically illustrating a solar cell module according to another embodiment of the present invention.

Referring to FIG. 11, the solar cell module 400 according to another embodiment of the present invention may include a sealing unit 410, a solar cell 420, an electrode 430, a first substrate 450, a second substrate 440, a transmissive coating layer 455, and a non-transmissive coating layer 445, and a description of components similar or identical to those of the above-described embodiments is replaced with the above description, and the transmissive coating layer 455 will be mainly described.

The transmissive coating layer 455 is disposed above the first substrate 450. In this case, the transmissive coating layer 455 is curved to correspond to the body 451. The transmissive coating layer 455 may include perhydropolysilazane (PHPS) and an inorganic material.

The perhydropolysilazane (PHPS) is converted into a silicon dioxide thin film by reacting with oxygen. Such a silicon dioxide thin film minimizes interference of sunlight transmission.

Specifically, the transmissive coating layer 455 is made of an inorganic material using perhydropolysilazane (PHPS) as a binder. And, the inorganic material implements visual color by reflecting light. In addition, the transmissive coating layer 455 includes various inorganic materials, and thus, various colors may be realized through various reflections according to the various inorganic materials.

Meanwhile, the transmissive coating layer 455 is not limited to being made of perhydropolysilazane (PHPS) and an inorganic material only, and may be made of various materials that implement colors while transmitting light.

As described above, the transmissive coating layer 455 transmits sunlight, there is an advantage in that interference of sunlight transmission is minimized to prevent efficiency of production of electric energy from being lowered, and also aesthetics are improved through implementation of various colors.

Although the embodiments of the present invention are described, the spirit of the present invention is not limited to the embodiments presented in the specification, and those skilled in the art who understand the spirit of the present invention may easily propose other embodiments within the same scope of the spirit of the present invention by adding, modifying, deleting, and adding components, but this is also within the scope of the present invention.

| 100 solar cell module | 110 sealing unit |
| 120 solar cell | 130 electrode |
| 140 a second substrate | 150 a first substrate |

What is claimed is:

1. A solar cell module, comprising:
   a solar cell including an electrode, the electrode configured to generate electricity using sunlight and transfer electricity;
   a first substrate above the solar cell; and
   a second substrate below the solar cell,
   wherein the first substrate comprises
      a body,
      a convex portion protruding upward from the body,
      a concave portion being closer to the body than the convex portion, and
      an inflection portion being at a midpoint between the convex portion and the concave portion,
   wherein a distance between the concave portion and the inflection portion is greater than a width of the electrode, and
   wherein the electrode has a circular cross-section, and
   wherein the electrode is disposed below a region between the concave portion and the inflection portion.

2. The solar cell module of claim 1, wherein the concave portion corresponds to a longitudinal direction of the electrode.

3. The solar cell module of claim 1, wherein an angle between the concave portion and the electrode is less than 20°.

4. The solar cell module of claim 1, wherein the width of the electrode is 180 to 350 μm, and the distance between the concave portion and the inflection portion is 500 μm.

5. The solar cell module of claim 1, wherein a first slope of a first curved surface between the concave portion and the inflection portion increases and a second slope of a second curved surface between the inflection portion and the convex portion decreases.

6. The solar cell module of claim 1, wherein a first slope of a first curved surface between the concave portion and the inflection portion and a second slope of a second curved surface between the inflection portion and the convex portion are same in the inflection portion.

7. The solar cell module of claim 1, further comprising:
   a non-transmissive coating layer below the second substrate.

8. The solar cell module of claim 1, wherein the second substrate comprises a second body having a curved surface.

9. The solar cell module of claim 1, further comprising:
   a transmissive coating layer above the first substrate.

10. The solar cell module of claim 8, further comprising:
    a non-transmissive coating layer below the second substrate.

* * * * *